United States Patent [19]

Wilson

[11] 4,009,423
[45] Feb. 22, 1977

[54] LIQUID COOLED HEAT EXCHANGER FOR ELECTRONIC POWER SUPPLIES

[75] Inventor: Edward A. Wilson, Phoenix, Ariz.

[73] Assignee: Honeywell Information Systems, Inc., Phoenix, Ariz.

[22] Filed: July 2, 1975

[21] Appl. No.: 592,579

[52] U.S. Cl. .............................. 361/385; 357/82; 165/DIG. 21; 165/80; 165/DIG. 3

[51] Int. Cl.² ................................... H01L 23/34

[58] Field of Search ............... 165/80, 46, DIG. 3, 165/DIG. 21; 317/100; 357/82

[56] References Cited

UNITED STATES PATENTS

| | | | |
|---|---|---|---|
| 3,048,374 | 8/1962 | Hughes | 165/DIG. 3 |
| 3,275,921 | 9/1966 | Fellendorf et al. | 165/DIG. 3 |
| 3,302,697 | 2/1967 | Jacko | 165/80 |
| 3,648,167 | 3/1972 | Purdy et al. | 165/80 X |
| 3,649,738 | 3/1972 | Andersson et al. | 165/80 X |

Primary Examiner—Albert W. Davis, Jr.
Attorney, Agent, or Firm—Edward W. Hughes; William W. Holloway, Jr.

[57] ABSTRACT

A liquid cooled heat exchanger particularly adapted to cool heat sinks of an electrical power supply for large electronic systems. The heat exchanger has thin flexible walls. Pressure of the coolant within the heat exchanger assures a positive mechanical contact between the heat exchanger and the heat sink, one that can accommodate changes in dimensions of the heat sink or heat exchanger and a lack of planarity of the surfaces of the heat sink without increasing the thermal impedance between the liquid in the heat exchanger and the heat sink. Fluid flow within the heat exchanger is controlled so that heat transfer efficiency between certain areas of the flexible walls and the coolant is maximized, which areas are proximate to the heat sources mounted on the heat sink.

6 Claims, 4 Drawing Figures

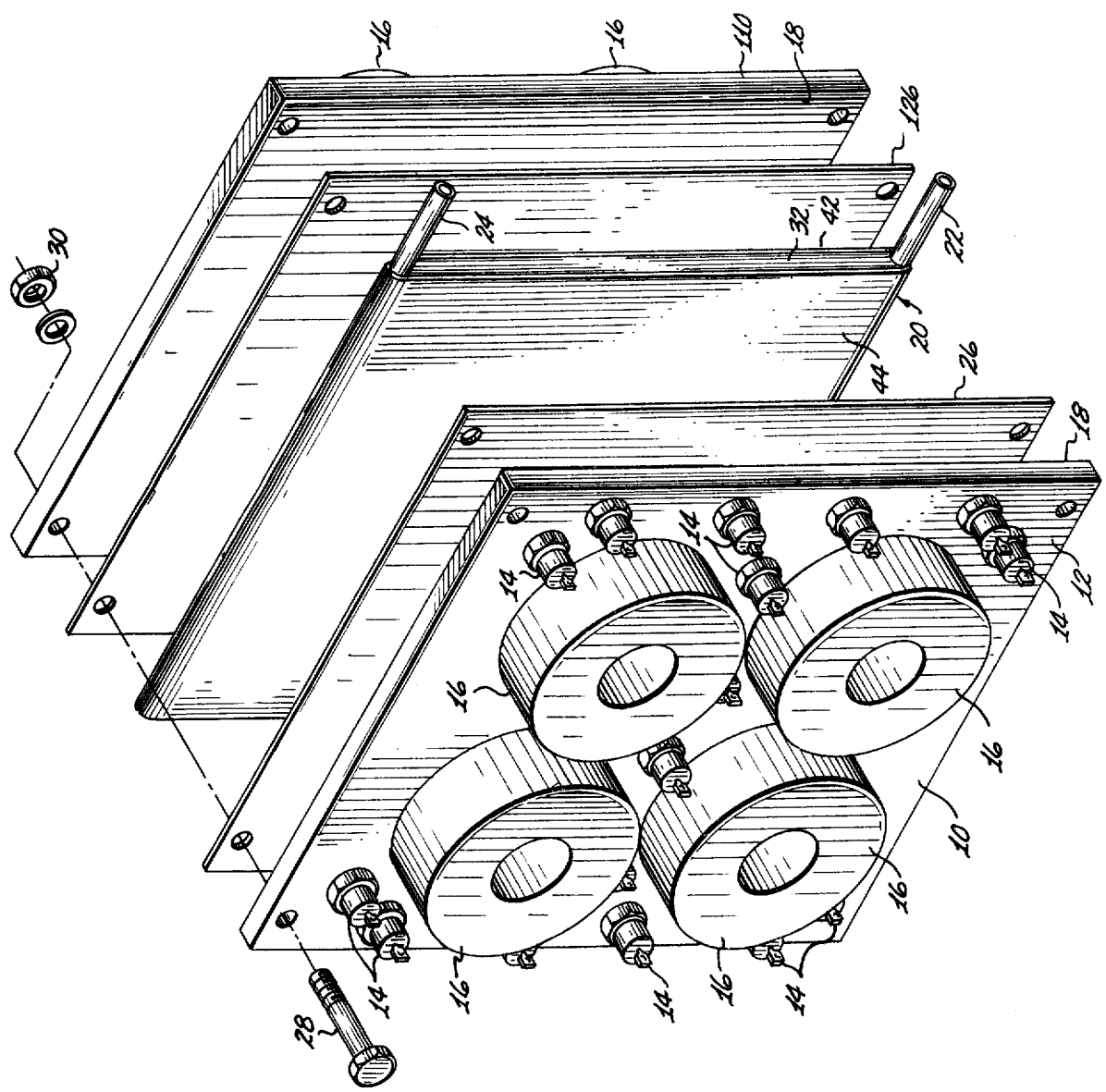

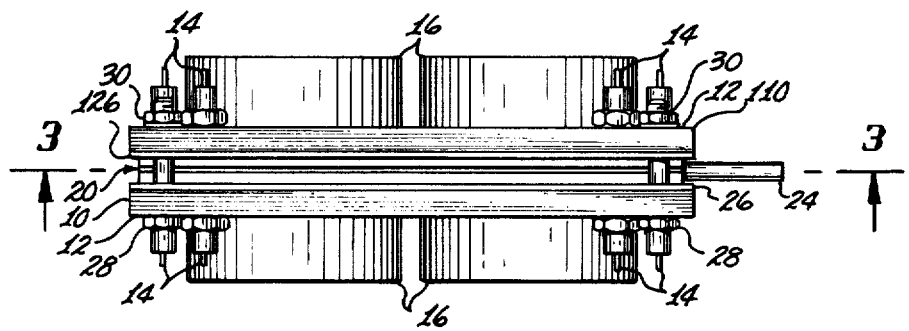
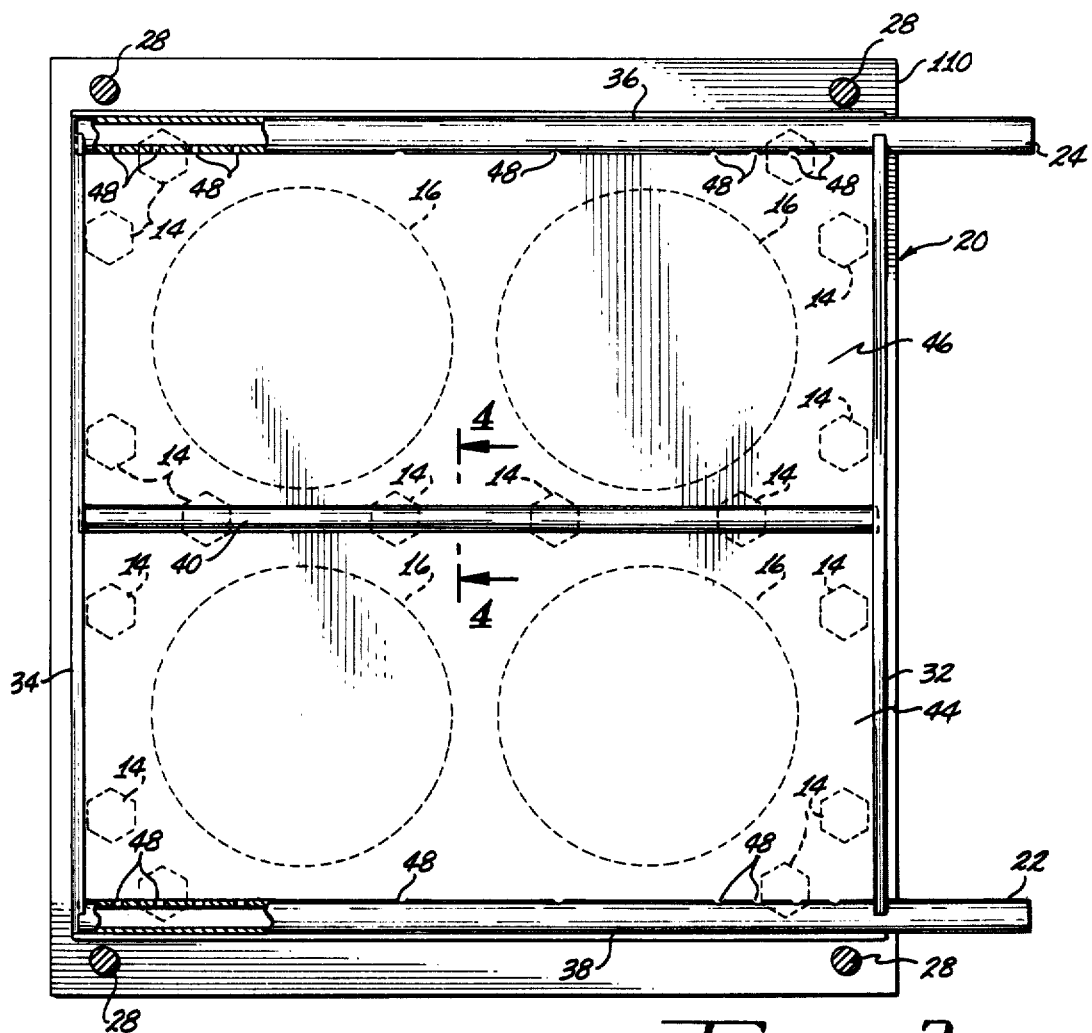
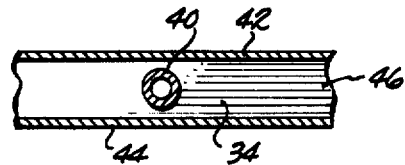

LIQUID COOLED HEAT EXCHANGER FOR ELECTRONIC POWER SUPPLIES

SUMMARY OF THE INVENTION

This invention relates generally to cooling means for an electrical power supply and more particularly to a heat exchanger through which a liquid coolant flows to remove heat from heat sinks on which heat producing elements of a power supply are mounted.

Power supplies of large solid state electronic systems such as large digital computers require regulated electrical power, i.e., electrical currents at the proper voltage levels and amperages. In most such systems the voltages are relatively low, i.e., from 1.5 to 12 volts, while the magnitude of the currents is large, from 100 to 1000 amperes, for example.

In such power supplies power diodes and reactors are the sources of from 80 to 90% of the heat produced. Until the present invention, the most common way to cool such power supplies was to mount the components on appropriately sized heat sinks which were provided with fins. Heat was removed from the heat sinks by air blowing along the fins. As the amount of electrical power to be supplied by such power supplies has increased, the heat produced has also increased so that the volume of the heat sinks or the velocity of the air to cool them or both have increased to maintain the components of the power supply within safe operating temperature ranges. A problem associated with air cooling large power supplies is the unacceptably high noise level associated with the high velocity of the cooling air.

The use of a liquid cooled heat exchanger to remove the heat from at least the major sources of a power supply has the advantages that it avoids most of the noise problems associated with air cooling an equivalent power supply, and at the same time it significantly reduces the total volume occupied by a power supply since the volume of a combination of a heat sink and a liquid cooled heat exchanger is several times smaller than the size of air cooled heat sinks required for an equivalent power supply.

While a liquid cooled heat exchanger solves many of the problems associated with air cooled power supplies, there are specific problems associated with liquid cooled systems. One is the result of the mounting plate or heat sink on which the major sources of heat are mounted also being used in some power supplies as an electrical bus. To prevent possible electrical short circuits in a power supply in which the heat sink is also used as an electrical bus, it is necessary that the heat exchanger be electrically isolated or insulated from the mounting plate or heat sink it cools.

To assure long trouble-free life of the power supply and its heat exchanger, it is desirable that the fluid flowing in the heat exchanger not contact the electrical insulation between the heat exchanger and the power supply so that the fluid does not erode or absorb the electrical insulating material over a substantial period of time. It is also desirable that the thermal impedance between a heat sink and the coolant in the heat exchanger removing heat from such sink be as low as possible. Both of the foregoing objectives are accomplished in the present invention by providing the heat exchanger with a thin flexible metal wall between the fluid flowing in the heat exchanger and the electrical insulation between the heat exchanger and the heat sink. Pressure of the coolant within the heat exchanger assures a positive mechanical or physical contact between the heat exchanger and the heat sink, one that can accommodate changes in dimensions of the heat sink or the heat exchanger and a lack of flatness or planarity of the surfaces of the heat sink without increasing the thermal impedance between the liquid within the heat exchanger and the heat sink.

Because of the substantial size of liquid cooled heat exchangers, approximately 9 inches × 9 inches in one example, and the size of the plate or heat sink on which the power diodes and reactors of a power supply are mounted, it is possible to locate the heat sources on the heat sink in a pattern or array which substantially coincides with the internal distribution of the stream lines of the liquid coolant so that the heat transfer efficiency of the heat exchanger is greater in those areas of the surface of the heat exchanger nearest the heat sources mounted on the heat sink.

Therefore, it is an object of the present invention to provide means for cooling sources of heat mounted on a heat sink.

It is another object of the present invention to provide an improved liquid cooled heat exchanger for heat sinks of an electronic power supply.

It is still another object of the present invention to provide a liquid cooled heat exchanger for a heat sink in which the heat sink is also an element of an electrical circuit, in which the heat exchanger is electrically insulated from the heat sink, and in which the liquid in the heat exchanger is mechanically isolated from the electrical insulation.

It is also an object of this invention to provide a liquid cooled heat exchanger for a heat sink in which the efficiency of heat transfer is increased in those portions of the heat exchanger closest to the sources of the heat mounted on the heat sink.

These and other objects of the present invention are achieved according to one embodiment thereof by providing a heat exchanger which has a pair of substantially planar flexible walls made of a good thermal conductive metal. Inlet and outlet means are provided so a heat exchange medium or liquid coolant can flow through the heat exchanger and contact the inner sides of the flexible walls of the heat exchanger to conduct heat away from heat sinks on which sources of heat are mounted. The heat exchanger may be mounted between a pair of heat sinks and may be electrically isolated from them by thin layers of electrical insulation. The heat sinks, insulating layers, and heat exchangers are brought into close physical contact or proximity by appropriate fastening means. The flow patterns of the liquid coolant within the heat exchanger are chosen so that higher heat transfer efficiencies between the flexible wall of the heat exchanger and the heat sinks liquid coolant occur in those areas of the flexible wall of the heat exchanger close to the sources of the heat mounted on the heat sinks. The flexible wall of the heat exchanger due to the pressure of the liquid coolant flowing through it produces a low thermal impedance path between the coolant in the heat exchanger and the heat sink notwithstanding changes in the dimensions of the heat sinks because of temperature changes, for example, or deviations of the surfaces of the heat sinks from being substantially planar.

BRIEF DESCRIPTION OF THE DRAWINGS

This invention is pointed out with particularity in the appended claims, however, other objects and features of the invention will become more apparent and the invention itself will be better understood by referring to the following description and embodiments taken in conjuntion with the accompanying drawings in which:

FIG. 1 is an exploded perspective view illustrating the relationships between a pair of heat sinks of a power supply and a liquid cooled heat exchanger;

FIG. 2 is a plan view of the assembled components illustrated in FIG. 1;

FIG. 3 is a section taken along line 3—3 of FIG. 2 with sources of the heat mounted on the heat sink illustrated in dotted lines; and FIG. 4 is an enlarged fragmentary section taken along lines 4—4 of FIG. 3.

DETAILED DESCRIPTION

In FIG. 1 there is illustrated mounting plates or heat sinks 10 and 110 of a power supply for an electronic system such as digital computer. Since power supplies per se do not form a part of this invention, only those portions of a conventional power supply that are relevant to an understanding of this invention are illustrated. On side 12 of plates 10, 110 are mounted power diodes 14 and reactors 16. Plates 10 and 110 may be of any suitable size but in one preferred embodiment the area of surface 12 was slightly larger than 9 × 9 inches. Plates 10, 110 can be made of any suitable electrical and thermal conductor such as aluminum, copper, silver or steel. However, in a preferred embodiment they are made of aluminum. The thickness of the plates is determined primarily by thermal considerations and the length of the mounting studs of the power diodes 14. In a preferred embodiment the thickness was one-half inch. The surfaces 18 of plates 10 and 110 are substantially planar. Plates 10 and 110 also serve as electrical buses through which electrical current flows to or from diodes 14 and reactors 16. Electrical conductors which interconnect plates 10, 110 to other components of the power supply are not illustrated. Liquid cooled heat exchanger 20 is provided to remove substantial quantities of heat from heat sinks 10, 110. In one embodiment the amount of heat produced by the diodes and reactors attached to plate 10, for example, was in the order of 500 watts. Heat exchanger 20 is provided with inlet means 22 and outlet means 24 so that a liquid coolant can flow through it. To electrically isolate heat exchanger 20 from plates 10, 110 thin sheets of electrical insulation 26, 126 such as Mylar, 1–2 mils thick is placed between heat sinks 10, 110 and heat exchanger 20. Heat sinks 10, 110, electrical insulation 26, 126, and heat exchanger 20 are fixedly held together by any suitable fastening means such as bolts 28 and nuts 30. It should be noted that bolts 28 do not contact heat exchanger 20 in order to preserve the electrical isolation between plates 10, 110 and heat exchanger 20.

In FIGS. 3 and 4, details of heat sink 20 are illustrated. Heat exchanger 20 has a pair of end walls 32, 34. Side walls 36, 38 are illustrated as being tubes or fluid conducting means. Inlets 22 and outlets 24 are illustrated as being an integral part or extension of conduit means 38, 36, respectively. Between end walls 32 and 34 and substantially parallel to side walls 36, 38 there is located hollow rod 40. End walls 32, 34 and side walls 36, 38 form the substantially rigid periphery of heat exchanger 20. Flexible walls 42, 44 are secured to walls 32, 34, 36, 38 to define a liquid containing chamber 46. Flexible walls 42, 44 are substantially planar when chamber 46 does not contain any liquid coolant. Referring now to FIG. 4, it should be noted that the diameter or rod or flow constrictor 40 is less than the height of end walls 32, 34 and the diameter of side walls 36, 38 so that flexible walls 42, 44 can move toward rod 40 a relatively substantial distance before they contact it. Openings 48 are formed in the liquid conduit means 36 and 38 to permit liquid coolant supplied from a conventional source such as a pump, which is not illustrated, under pressure to flow through chamber 46. Liquid flowing through outlet 24 is returned either to the source connected to inlet 22 where it can be cooled and recirculated or possibly discharged into any suitable sump which is not illustrated.

The locations of fluid flow directing means, or opening 48 in conduits 36, 38 are chosen so that the stream lines of fluid flow, the paths molecules of the liquid coolant will take, are concentrated in those areas of the flexible wall 42, 44 which are in proximity to the major sources of heat; i.e., diodes 14 which account for from 80 to 90% of the heat dissipated through heat sink 10, for example, and reactors 16. Diodes 14 and reactors 16 are illustrated by dotted lines in FIG. 3. Flow constrictor 40 achieves a similar result in a different manner by increasing the turbulence of the flow of the liquid coolant and its velocity in proximity to the areas of flexible walls 42, 44 in the vicinity of rod 40, which areas it should be noted are normal to the direction of flow of the coolant. Mixing of the coolant induced by the presence of rod 40 also lowers the temperature of the coolant. Both techniques, i.e., concentrating fluid flow by appropriate placement of fluid flow directing means 48 in conduit means 36, 38 and the use of the flow constrictors such as rod 40, increases heat transfer efficiency; or to state it another way, they reduce the effective thermal impedance of predetermined areas of the flexible walls 42, 44 of heat exchanger 20 by increasing the convection heat transfer coefficient between flexible walls 42, 44 and the coolant flowing through chamber 46. Increasing the heat transfer efficiency in the vicinity of the sources of the heat mounted on heat sinks 10, 110 reduces the maximum operating temperatures of the sources, if all other conditions remain the same.

In a preferred embodiment end walls 32, 34, side walls 36, 38, rod 40 and flexible walls 42, 44 were all made of copper which is soldered together to form heat exchanger 20. The end walls 32, 34 were made of flat copper stock having dimensions of ⅜ inch × ⅛ inch and side walls 36, 38 were made of ⅜ inch outside diameter copper tubing. Rod 40 was made of ¼ inch outside diameter copper tubing. Flexible walls 42, 44 were made of copper sheets from 10 to 16 mils thick. Forming the heat exchanger 20 out of one type of metal, copper in the preferred embodiment, avoids any problem that could arise due to galvanic corrosion. Obviously other materials can be used such as aluminum, silver, or stainless steel, for example. It is also possible that the side walls 32, 34 and the fluid conduit means 36, 38 could be made of a suitable non-electrical conductor such as plastic.

In operation the plates 10, 110 and the insulating layers 26, 126 and the heat exchanger 20 are securely fastened together by fastening means 28, 30. Water, the preferred liquid coolant, is supplied to inlet 22 and flows through chamber 46 of heat exchanger 20 and out of it through outlet 24. Openings 48 and flow constrictor 40 are located so that the areas of maximum heat transfer efficiency are located in proximity to the heat sources mounted on plates 10, 110. Pressure of the water flowing through heat exchanger 20 presses the flexible walls 42, 44 firmly against the electrical insulation 26, 126 and against heat sinks 10, 110 to assure minimal thermal impedance between the heat sinks 10, 110 and the liquid coolant in heat exchanger 20. The flexibility of walls 42, 44 assure that any dimensional changes, due to temperature for example, do not have a deleterious impact on thermal impedance. Further such flexible walls eliminate the requirement for a high degree of flatness or planarity of the surfaces 18 of the heat sinks 10, 110. It should be noted that the locations of the sources of heat on plates 10, 110 are similar in the embodiment illustrated. This is not a necessary requirement but it is preferable for the major sources of heat to be located in the vicinity of areas of high heat transfer efficiency in order to mimimize their operating temperatures.

The heat exchange medium or liquid can be almost any suitable one such as silicone oil, ethylene glycol, Freon 113 or water. While any of these coolants are satisfactory, water is preferred because of its thermal property. It permits lower pressures in the system, and it does not have any deleterious effect on the flexible walls 42, 44 of heat exchanger 20. To minimize corrosion and potential odor problems, sterilized water is used to which is added a conventional corrosion inhibitor.

In a preferred embodiment the temperature of the liquid coolant at inlet 22 was 30° C. This was chosen to minimize the risk of moisture in the atmosphere condensing on heat exchanger 20 and conduits which are not illustrated to connect it to a suitable source which also is not illustrated. With the diodes and reactors mounted on the plates 10, 110 producing around 500 watts for each heat sink, the maximum temperature rise of the coolant in heat exchanger 20 was 8° C with a flow rate of 0.5 gallon per minute. This was more than adequate to maintain the maximum temperature of the power diodes 10° C below their maximum allowable operating temperature. It has been found that a pressure of the liquid coolant of around 5 pounds per square inch in heat exchanger 20 is adequate to cause flexible walls 42, 44 to engage the insulating layers 26, 126 with sufficient force to minimize the thermal impedance between the heat sinks 10, 110 and the heat exchanger 20.

It will be apparent to those skilled in the art that the disclosed liquid cooled heat exchanger for an electronic power supply may be modified in numerous ways and may assume many embodiments other than the preferred form specifically set forth above and described above. Accordingly, it is intended by the appended claims to cover all modifications of the invention which falls within the true spirit and scope thereof.

What is claimed is:

1. In combination:
a plate formed of a thermal conductor, at least one surface of said plate being substantially planar;
said plate adapted to have a heat source mounted on it in a predetermined location other than on said one surface;
a heat exchanger having a substantially planar flexible wall made of a thermal conductor;
means for supplying and removing fluid under pressure to and from said heat exchanger;
means for mounting the plate and heat exchanger in substantially fixed relationship with one another with the flexible wall of the heat exchanger adjacent said one surface of said plate; and
means in said heat exchanger to cause the velocity of the liquid in said heat exchanger flowing over the flexible wall to be greater in a predetermined area corresponding to said predetermined location of the heat source on said plate.

2. In combination:
a plate formed of an electrical and thermal conductor, at least one surface of said plate being substantially planar;
said plate adapted to have a plurality of heat sources mounted on it in a predetermined pattern other than on said one surface;
a heat exchanger having a substantially planar flexible wall made of a thermal conductor;
means for supplying and removing a liquid under pressure to and form said heat exchanger;
a thin layer of electrical insulation;
means for mounting the plate, the electrical insulation and heat exchanger in substantially fixed relationship with one another so that the electrical insulation is between said one surface of said plate and the flexible wall of the heat exchanger; and
means in said heat exchanger to cause the velocity of the liquid in said heat exchanger flowing over the flexible wall to be greater in predetermined areas corresponding to said predetermined pattern of the heat sources.

3. In an electrical power supply having a plate having sides; said plate having sources of heat mounted on one side, the other side having a substantially planar surface; said mounting plate being a heat sink for said sources of heat, the improvements comprising:
a heat exchanger having substantially rigid wall means defining a periphery substantially located in a plane, first and second fluid conducting means being formed in portions of said wall means;
a flexible wall made of a thermal conductor connected to the periphery of the wall means to define a closed space adapted to contain a liquid under pressure;
inlet means connected to said first fluid conducting means, said inlet means adapted to be connected to a source of liquid coolant under pressure;
outlet means connected to said second fluid conducting means through which liquid coolant can flow out of the heat exchanger;
fluid flow directing means in said first and second fluid conducting means so that the stream lines of fluid flow between the first and second fluid conducting means have a predetermined pattern;
a thin layer of electrical insulation material; and
means for fixedly attaching the heat exchanger to the plate with the electrical insulation material between the substantial planar surface of said plate and the flexible wall means of the heat exchanger, the pattern of stream lines in the heat exchanger being such that the maximum velocity of fluid flow occurs in those areas of the flexible surface closest to the heat sources mounted on said plate.

4. In an electrical power supply having a pair of plates, each plate having at least two sides, sources of heat being mounted on one side of each plate and the other side of each plate having a substantially planar surface, said mounting plates being a part of an electrical circuit of the power supply and also being a heat sink for said sources of heat mounted on them, the improvements comprising:

a heat exchanger having substantially rigid wall means defining two peripheries, each periphery substantially defining a plane, first and second fluid conducting means formed in portions of said wall means;

a pair of flexible walls made of a thermal conductor connected to the peripheries of the rigid wall means to define a closed space adapted to contain a liquid under pressure;

inlet means connected to said first fluid conducting means, said inlet means adapted to be connected to a source of liquid coolant under pressure;

outlet means connected to said second fluid conductor means through which liquid coolant can flow out of the heat exchanger;

openings formed in said first and second fluid conducting means;

flow constrictor means mounted in said heat exchanger, said openings and constrictor causing the distribution of the velocity of fluid flow between the first and second fluid conductor means to have a predetermined pattern;

a pair of layers of electrical insulation;

means for fixedly attaching the plates to the heat exchanger with the electrical insulation between the substantial planar surfaces of said plates and the flexible wall means of the heat exchanger so that higher heat transfer efficiencies occur at areas of the flexible surfaces of the heat exchanger proximate the sources of heat mounted on said plates.

5. A heat exchanger comprising:
a pair of end walls;
a pair of tubes forming side walls;
a pair of thin flexible walls made of a thermal conductor;
said end walls, side walls and flexible walls forming a liquid tight chamber; and
openings in said tubes within said chamber,
one of said tubes adapted to be connected to a source of liquid under pressure and the other tube adapted to be connected to means through which liquid can be removed from said heat exchanger so that a liquid coolant under pressure can flow through the heat exchanger, said openings in said tubes being located so that the stream lines of fluid flowing between said tubes will have a predetermined pattern.

6. A heat exchanger comprising:
a pair of end walls;
a pair of tubes forming side walls;
a pair of thin flexible walls made of a thermal conductor;
said end walls, side walls and flexible walls forming a liquid tight chamber;
openings in said tubes within said chamber,
one of said tubes adapted to be connected to a source of liquid under pressure and the other tube adapted to be connected to means through which liquid can be removed from said heat exchanger so that a liquid coolant can flow through the heat exchanger, said openings being located so that the stream lines of fluid flowing between said tubes will have a predetermined pattern; and
flow constrictor means between said end walls to increase the rate of fluid flow between the flow constrictor and at least one of said flexible walls.

* * * * *